US006484634B1

(12) United States Patent
Kasai et al.

(10) Patent No.: US 6,484,634 B1
(45) Date of Patent: Nov. 26, 2002

(54) BLOCK COPY SHEET FOR LITHOGRAPHIC PRINTING PLATE

(75) Inventors: Seishi Kasai, Shizuoka (JP); Takao Nakayama, Shizuoka (JP); Hiroyuki Ohishi, Shizuoka (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 174 days.

(21) Appl. No.: 09/652,790

(22) Filed: Aug. 31, 2000

(30) Foreign Application Priority Data

Sep. 1, 1999 (JP) .......................................... 11-247761
Sep. 20, 1999 (JP) .......................................... 11-265772

(51) Int. Cl.$^{7}$ .............................. G03F 7/11; B41N 6/00

(52) U.S. Cl. .................... 101/375; 101/141; 101/382.1; 101/395; 101/401.1; 101/401.3; 101/453; 101/415; 101/460; 430/271.1

(58) Field of Search ........................... 430/271.1, 270.1, 430/302; 101/141, 375, 382, 395, 401.1, 401.3, 415, 453, 460

(56) References Cited

U.S. PATENT DOCUMENTS

| | | | | |
|---|---|---|---|---|
| 5,410,963 A | * | 5/1995 | Steadman | 101/376 |
| 5,775,225 A | * | 7/1998 | Saitou | 101/415.1 |
| 6,176,182 B1 | * | 1/2001 | Nakayama et al. | 101/375 |
| 6,305,283 B1 | * | 10/2001 | Verschueren et al. | 101/453 |
| 6,314,883 B1 | * | 11/2001 | Wech | 101/248 |
| 6,386,104 B1 | * | 5/2002 | Kasai et al. | 101/375 |
| 6,397,746 B1 | * | 6/2002 | Nakayama et al. | 101/375 |
| 2002/0017208 A1 | * | 2/2002 | Kasai et al. | 101/375 |

FOREIGN PATENT DOCUMENTS

| | | | | |
|---|---|---|---|---|
| JP | 10-193828 | | | 7/1998 |
| JP | 11-20130 | | | 1/1999 |
| JP | 2000-318339 | A | * | 11/2000 |
| JP | 2000-318340 | A | * | 11/2000 |
| JP | 2000-318341 | A | * | 11/2000 |
| JP | 2000-318342 | A | * | 11/2000 |
| JP | 2001-18363 | A | * | 1/2001 |
| JP | 2001-30649 | A | * | 2/2001 |
| JP | 2001-71659 | A | * | 3/2001 |
| JP | 2001-88460 | A | * | 4/2001 |
| JP | 2001-96841 | A | * | 4/2001 |
| JP | 2001-113852 | A | * | 4/2001 |
| JP | 2001-130165 | A | * | 5/2001 |
| JP | 2001-138661 | A | * | 5/2001 |
| JP | 2001-219668 | A | * | 8/2001 |
| JP | 2001-260320 | A | * | 9/2001 |
| JP | 2001-260560 | A | * | 9/2001 |
| JP | 2001-310441 | A | * | 11/2001 |
| JP | 2001-334770 | A | * | 12/2001 |
| JP | 2002-19322 | A | * | 1/2002 |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A block copy sheet for lithographic printing plate to be interposed between a plate cylinder and a lithographic printing plate having a front surface and a back surface, at least the back surface being made of a material other than metals, wherein the block copy sheet have convex portions provided on a surface thereof, the convex portions having a predetermined shape so as to concave the back surface of the lithographic printing plate when pressed against the back surface of the lithographic printing plate, and wherein (1) the convex portions comprises a composite particle having protrusions provided on the surface thereof and having a hardness greater than that of the back surface of the lithographic printing plate and a particle diameter of from 1 $\mu$m to 100 $\mu$m, or (2) the convex portions comprises non-spherical fillers having an average length of from 1 $\mu$m to 200 $\mu$m and the contact area of the convex portions and the back surface of the lithographic printing plate is from 0.6% to 3.0% of the area of the back surface of the lithographic printing plate.

17 Claims, 1 Drawing Sheet

BLOCK COPY SHEET FOR LITHOGRAPHIC PRINTING PLATE

FIELD OF THE INVENTION

The present invention relates to a block copy sheet for lithographic printing plate for preventing the positional deviation of the lithographic printing plate on a plate cylinder of a printing machine.

BACKGROUND OF THE INVENTION

In a lithographic printing machine, a lithographic printing plate is generally wound on and mechanically fixed to a plate cylinder to effect printing.

Heretofore, as the support for lithographic printing plate there has been used one made of metal, plastic film, paper or the like. A lithographic printing plate comprising a support made of a material other than metal exhibits an excellent handleability but an insufficient dimensional stability as compared with one comprising a support made of a metal.

Such a lithographic printing plate comprising a support made of a material other than metal at least on the back surface thereof, if mounted on a lithographic printing machine, tends to be poorly positioned when caught by the forward end of the plate cylinder because the support is soft. As a result, the precision in longitudinal positioning (precision in positioning in the direction along the circumference of the plate cylinder) is deteriorated. In some cases, the lithographic printing plate may be fixed obliquely deviated. Furthermore, there is a problem that the lithographic printing plate shows a deformation at some areas due to friction with the plate cylinder during printing to thereby cause deterioration of precision in positioning with respect to printing paper.

Accordingly, such a lithographic printing plate comprising a support made of a material other than metal at least on the back surface thereof is used only for printing of so small a number of sheets that no significant problems occur even if the precision in registration on printed matter is low. When used in multi-color precision printing or in printing of a large number of sheets using a large-sized printing machine, misregistration of colors may be caused.

On the other hand, plate-making method and printing method by CTP (computer to plate), which has recently spread, are advantageous in that the precision in dimension and positioning of image (exposure) with respect to the plate material, making registration in multi-color printing easy, as compared with the conventional plate making method and printing method (by contact exposure of plate material using a lithographic film).

However, due to the foregoing problems, the lithographic printing plate comprising a support made of a material other than metal such as plastic film and paper cannot make the best use of the advantage of CTP that registration in multi-color printing is easy.

In recent years, it has been proposed to provide a sheet material having an initial elasticity of 300 $kg/mm^2$ or less interposed between the printing plate and the plate cylinder to solve the foregoing problems (JP-A-11-20130 (The term "JP-A" as used herein means an "unexamined published Japanese patent application")). This sheet has fine glass beads adhered thereto so that the central line average roughness Ra is 2 or more.

However, as can be seen in the description of the above cited patent application that the sheet is prepared by densely and uniformly fixing fine glass beads or the like to the surface of a sheet-like material, the formation of roughness on the sheet material requires the use of a high concentration dispersion of fine particles.

In general, this kind of fine particles is expensive. Accordingly, in order to densely and uniformly fix such fine particles to the sheet-like material, a large amount of fine particles is required, adding to the cost of the sheet. Further, it is difficult to disperse fine particles in a liquid in a high concentration. Moreover, when dispersed in a high concentration, such fine particles can agglomerate in the liquid to form coarse particles that deteriorate the print quality.

SUMMARY OF THE INVENTION

It is therefore an object of the present invention to provide a block copy sheet for lithographic printing plate for preventing the positional deviation of a lithographic printing plate which can securely prevent the positional deviation of a lithographic printing plate on the plate cylinder of a press, making it possible to apply a lithographic printing plate comprising a support made of a material other than metal also to multi-color printing or printing of a large number of sheets, prevent the positional deviation of the printing plate, reduce the production cost and give an excellent productivity.

Other objects and effects of the present invention will become more apparent from the following description.

The above-described objects of the present invention have been achieved by providing the following block copy sheets.

In a first aspect, the present invention is directed to a block copy sheet for lithographic printing plate to be interposed between a plate cylinder and a lithographic printing plate having a front surface and a back surface, at least the back surface being made of a material other than metals, wherein said block copy sheet have convex portions provided on a surface thereof, said convex portions having a predetermined shape so as to concave the back surface of the lithographic printing plate when pressed against the back surface of the lithographic printing plate, and wherein said convex portions comprises a composite particle having protrusions provided on the surface thereof and having a hardness greater than that of the back surface of the lithographic printing plate and a particle diameter of from 1 $\mu$m to 100 $\mu$m.

The composite particle may comprise an inorganic material, an organic material, or an organic-inorganic composite material.

The sum of the maximum sectional area of said convex portions parallel to the surface of the sheet per unit area is preferably from 0.05% to 4%.

In a second aspect, the present invention is directed to a block copy sheet for lithographic printing plate to be interposed between a plate cylinder and a lithographic printing plate having a front surface and a back surface, at least the back surface being made of a material other than metals, wherein said block copy sheet have convex portions provided on a surface thereof, said convex portions having a predetermined shape so as to concave the back surface of the lithographic printing plate when pressed against the back surface of the lithographic printing plate, wherein the contact area of said convex portions and the back surface of the lithographic printing plate is from 0.6% to 3.0% of the area of the back surface of the lithographic printing plate, and wherein said convex portions comprises non-spherical fillers having an average length of from 1 $\mu$m to 200 $\mu$m.

The non-spherical fillers may be tabular-shaped, acicular-shaped or tetrapod-shaped.

BRIEF DESCRIPTION OF THE DRAWING

By way of example and to make the description more clear, reference is made to the accompanying drawing in which.

DETAILED DESCRIPTION OF THE INVENTION

Figure 1:
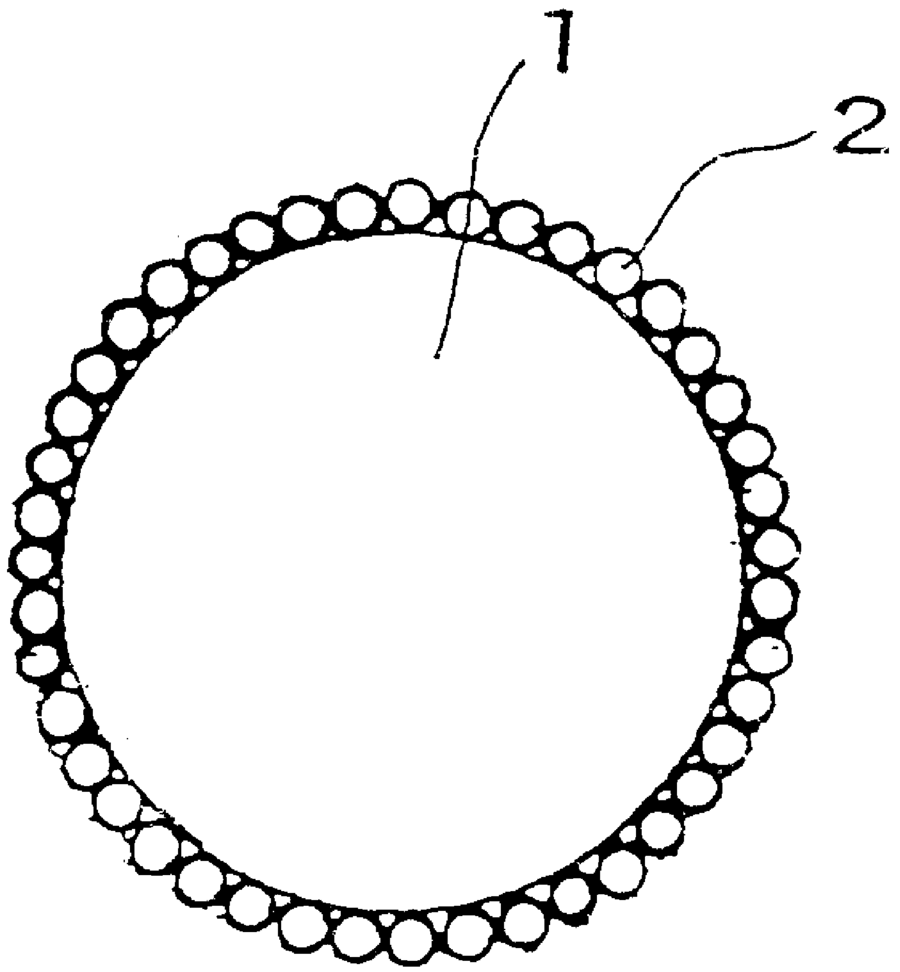
FIG. 1 is a schematic enlarged sectional view illustrating an embodiment of the composite particle for use in the invention, in which the reference numeral 1 indicates a particle, and the reference numeral 2 indicates a minute protrusion.

The present invention will be further described in detail below.

As the particulate material to be used to form convex portions on the block copy sheet in the first aspect of the present invention there is used a composite particle having protrusions provided on the surface thereof and having a diameter of from 1 $\mu$m to 100 $\mu$m.

As illustrated in FIG. 1, the term "composite particle" as used herein is meant to indicate a structure comprising: a particle 1 having a diameter of from 1 $\mu$m to 100 $\mu$m and comprising an inorganic material (including glass), an organic material, a composite of organic material with inorganic material (hereinafter referred to as "organic-inorganic composite") or the like; and minute inorganic protrusions 2, if the particle 1 is made of an inorganic material, or minute organic protrusions 2, if the particle 1 is made of an organic material, fixed to the surface thereof. Alternatively, the composite particle may comprises an inorganic material core particle and organic material protrusions or comprises an organic material core particle and inorganic material protrusions.

The composite particle to be used in the first aspect of the present invention can be synthesized by any of the method involving heterocondensation and the method involving the polymerization reaction on the surface of core particles as described, for example, in "Biryushi Polymer no Shintenaki (New Development of Finely Particulate Polymer", Toray Research Center Co., Ltd., and the dry condensation agitation method using a hybridizer as described in "Ryushi Sekkei Kogaku (Particle Design Engineering)", Association of Powder Technology.

The average particle diameter of the composite particle falls within the range of from 1 $\mu$m to 100 $\mu$m, preferably from 3 $\mu$m to 80 $\mu$m, more preferably from 5 $\mu$m to 50 $\mu$m. The average particle diameter of the particle constituting the core of the composite particle falls within the range of from 1 $\mu$m to 100 $\mu$m, preferably from 3 $\mu$m to 80 $\mu$m, more preferably from 5 $\mu$m to 50 $\mu$m. The average particle diameter of the particle constituting the shell of the composite particle falls within the range of from 0.01 $\mu$m to 10 $\mu$m, preferably from 0.05 $\mu$m to 8 $\mu$m, more preferably from 0.05 $\mu$m to 5 $\mu$m.

Examples of the inorganic material for use in the composite particle include metal powder, metal oxide powder, metal nitride powder, metal sulfide powder, metal carbide powder, and composites thereof. Preferred among these inorganic materials are metal oxide powder and metal sulfide powder. Further preferred examples thereof include glass, oxide such as $SiO_2$, $TiO_2$, ZnO, $Fe_2O_3$, $ZrO_2$ and $SnO_2$, and sulfide such as ZnS and CuS.

Examples of the organic material for use in the composite particle include synthetic resin particle and natural polymer particle. Preferred examples of these organic materials include acrylic resin, polyethylene, polypropylene, polyethylene oxide, polypropylene oxide, polyethyleneimine, polystyrene, polyurethane, polyurea, polyester, polyamide, polyimide, carboxymethyl cellulose, gelatin, starch, chitin, and chitosan. Particularly preferred examples thereof are synthetic resins such as acrylic resin, polyethylene, polypropylene, and polystyrene.

The amount of the composite particle to be used is not specifically limited. In order to obtain the desired effect, it is preferred that the sum of the maximum sectional area of the convex portions formed by the composite particle parallel to the surface of the sheet per unit area fall within the range of from 0.05% to 4% of the unit area. In this arrangement, the positional deviation of the printing plate on the plate cylinder can be securely prevented by the use of a relatively small amount of particles. In the following description, the proportion of the sum of the maximum sectional area of the convex portions formed by the composite particle parallel to the surface of the sheet in unit area is defined as "area percentage occupation".

The area percentage occupation defined in the preferred embodiment of the first aspect of the present invention is calculated in the following manner.

In some detail, the surface of the sample is photographed from above under an optical microscope. From the photograph, the number n of composite particles present on a unit area S is read. Using the value n and the average diameter R of the particles, the area percentage occupation is calculated by the following equation: Area percentage occupation=$(n\times(\pi R^2/4)/S)\times 100$ (%)

In the block copy sheet for lithographic printing plate according to the first aspect of the present invention, the composite particles, even if provided on the surface of the block copy sheet in a relatively small amount, can concave and be embeded into the back surface of the lithographic printing plate extremely effectively when pressed against the back surface of the lithographic printing plate. Accordingly, the lithographic printing plate can be securely prevented from being positionally deviated on the plate cylinder due to pressure during printing or other actions by a press.

As the method for forming convex portions on the substrate of the block copy sheet according to the first aspect of the present invention there may be used a method which comprises fixing composite particles having a greater hardness than the back surface of the support of the lithographic printing plate to the surface of the substrate of the block copy sheet to form convex portions thereon. In this case, it is preferred that the minute protrusions formed on the surface of the composite particle be also harder than the back surface of the support of the lithographic printing plate.

Specific examples of the method for fixing particles to the surface of the substrate of the block copy sheet according to the first aspect of the present invention to form convex portions therein include a method which comprises applying a dispersion of composite particles in a binder to the surface of the substrate of the block copy sheet, and then drying the coated material, and a method which comprises embedding composite particles into a formed binder film under mechanical pressure.

In the second aspect of the present invention, the average length of the non-spherical fillers is from 1 $\mu$m to 200 $\mu$m. When the average length of the non-spherical fillers falls below 1 $\mu$m, the contact area cannot be adjusted to 3.0% or less, even if the dispersion conditions or the kind of the binder used is changed. On the contrary, when the average length of the non-spherical fillers exceeds 200 $\mu$m, the fillers can be peeled off from the substrate.

As the material of the tabular filler there may be used talc, mica, glass flake, synthetic hydrotalcite or the like.

As the material of the acicular filler there may be used wollastonite, potassium titanate, basic magnesium sulfate, sepiolite, xonotlite, aluminum borate or the like.

As the material of the tetrapod-like filler there may be used zinc oxide or the like.

The use of these fillers eliminates the necessity of using a large number of fine particles as described in the above cited JP-A-11-20130, making it possible to securely prevent the positional deviation of the printing plate on the plate cylinder even when a relatively small amount of fillers is used.

In the second aspect of the present invention, the measurement of the contact area of the convex portions provided on the surface of the block copy sheet with the back surface of the lithographic printing plate can be accomplished as follows. In some detail, the press is operated with the block copy sheet being interposed between the lithographic printing plate and the plate cylinder until the plate cylinder is rotated 10 times. Thereafter, the back surface of the lithographic printing plate is magnified and photographed under optical microscope. From the photograph thus taken, the area of the concaved portions developed by the protrusions on the surface of the block copy sheet is read to determine the contact area.

The non-spherical filler to be used in the second aspect of the invention may be in the form of tablet, needle, disc, ellipsoid, flat disc, rectangle, triangle, snowman, confeitos, tetrapod or the like. Preferred among these forms are tablet, needle, and tetrapod.

As the composition of the non-spherical filler there may be used any of inorganic material, organic material and inorganic-organic composite material.

Examples of the inorganic compound employable herein include metal powder, mineral powder, metal oxide powder, metal nitride powder, metal sulfide powder, metal carbide powder, and composite compound powder. Preferred among these inorganic compounds are metal powder, mineral powder, metal oxide powder, and metal sulfide powder.

Examples of the organic compound employable herein include synthetic resins and natural high molecular compounds. Preferred examples of these organic compounds include acrylic resin, polyethylene, polypropylene, polyethylene oxide, polypropylene oxide, polyethyleneimine, polystyrene, polyurethane, polyurea, polyester, polyamide, polyimide, carboxymethyl cellulose, gelatin, starch, chitin, and chitosan.

An example of the inorganic-organic composite compound is a composite comprising at least one of the foregoing inorganic compounds and organic compounds.

The average length of the non-spherical fillers is from 1 $\mu$m to 200 $\mu$m, preferably from 3 $\mu$m to 100 $\mu$m, more preferably from 5 $\mu$m to 100 $\mu$m. When the average length of the non-spherical fillers falls below 1 $\mu$m, the contact area cannot be adjusted to 3.0% or less, even if the dispersion conditions or the kind of the binder used is changed. On the contrary, when the average length of the non-spherical fillers exceeds 200 $\mu$m, the fillers can be peeled off from the substrate.

As the method for forming convex portions on the substrate of the block copy sheet according to the second aspect of the present invention there may be used a method which comprises fixing a filler such as glass having a greater hardness than the support of the lithographic printing plate to the surface of the substrate of the block copy sheet.

Specific examples of the method for fixing non-spherical fillers to the surface of the substrate of the block copy sheet according to the second aspect of the present invention include a method which comprises applying a dispersion of non-spherical fillers in a binder to the surface of the substrate of the block copy sheet and then drying the coated material, a method which comprises embedding non-spherical fillers into a formed binder film under mechanical pressure, and a method which comprises electrodepositing non-spherical fillers on a formed binder film.

In the present invention, the concaving of the back surface of the lithographic printing plate may take place at the step of winding the lithographic printing plate and the block copy sheet on the plate cylinder so that the block copy sheet is provided interposed between the lithographic printing plate and the plate cylinder. Alternatively, the concaving of the back surface of the lithographic printing plate may not take place at the step of providing the block copy sheet interposed between the lithographic printing plate and the plate cylinder but may take place only when printing pressure is applied to the laminate of the lithographic printing plate, the block copy sheet and the plate cylinder.

The kind of the lithographic printing plate to be used herein is not specifically limited. Examples of the lithographic printing plate employable herein include ordinary PS plate, printing plate having a silver diffusive photographic layer, and printing plate prepared by electrophotographic plate-making method.

Examples of the binder employable herein include resin emulsion, resin soluble in a solvent, inorganic sol-gel, and resin-inorganic sol-gel composite. Preferred examples of these binder materials include resin emulsion such as acryl emulsion, urethane emulsion, polyethylene emulsion, vinyl acetate emulsion and polyester emulsion, resin soluble in a solvent such as acrylic resin, polyethylene, vinyl acetate, polyurethane, polyester and polyvinyl chloride, inorganic sol-gel such as silica sol-gel, titanium sol-gel and aluminum sol-gel, and resin-inorganic sol-gel composite such as polyvinylpyrrolidone-silica composite sol-gel, PVA-silica composite sol-gel and carboxymethyl cellulose-silica composite sol-gel. Preferred among these binder materials are resin emulsion such as acryl emulsion and urethane emulsion, resin soluble in a solvent such as acrylic resin and polyethylene, inorganic sol-gel such as silica sol-gel, and resin-inorganic sol-gel composite such as polyvinylpyrrolidone-silica composite sol-gel and PVA-silica composite sol-gel. These binders may undergo self-crosslinking reaction and/or introduce a crosslinked structure produced in the presence of a crosslinking agent used in combination therewith to become hard.

As the substrate of the block copy sheet there may be used a metal plate, resin sheet, metal-resin composite sheet or the like. Preferred examples of these materials include metal plate such as aluminum plate, zinc plate, titanium plate and stainless steel plate, bimetal plate such as copper-aluminum plate, copper-stainless steel plate and chromium-copper plate, trimetal plate such as chromium-copper-aluminum plate, chromium-lead-iron plate and chromium-copper-stainless steel plate, resin sheet such as PET sheet, PE sheet, PP sheet, polyester sheet, polyimide sheet, polyamide sheet and acrylic resin sheet, and metal-resin composite sheet such as aluminum-PET sheet, aluminum-PE sheet, aluminum-polyester sheet, titanium-PET sheet and titanium-PE sheet. Particularly preferred among these materials are metal plate such as aluminum plate and stainless steel plate, resin sheet such as PET sheet and PE sheet, and metal-resin composite sheet such as aluminum-PET sheet and aluminum-polyester sheet.

As the method for fixing the block copy sheet to the plate cylinder there may be used a method which comprises providing an adhesive layer comprising an adhesive such as spray paste and double-sided adhesive sheet on the back surface of the substrate of the block copy sheet. Alternatively, the block copy sheet may be engaged with a nib provided on the plate cylinder at the forward and tail ends thereof rather than being bonded to the plate cylinder with an adhesive layer. These methods may be used in combination.

The operation of the present embodiment of implication of the present invention is described below.

In order to effect printing by a lithographic printing machine, the various lithographic printing plates are each mounted on the plate cylinder of the respective printing unit with a block copy sheet provided interposed therebetween. During this procedure, the various block copy sheets are each pressed against the back surface of the respective lithographic printing plate to cause the convex portions formed on the surface of the substrate of the block copy sheet to concave and be embedded into the back surface of the lithographic printing plate.

Thus, the various block copy sheets each act to adjust the printing pressure developed by the blanket cylinder and impression cylinder as well as prevent the positional deviation of the lithographic printing plate on the plate cylinder due to pressure.

The method for preventing the positional deviation of the lithographic printing plate is described below.

A block copy sheet comprising convex portions having a desired shape provided on the surface of the substrate thereof is provided interposed between the lithographic printing plate and the plate cylinder of each printing unit. During this procedure, the convex portions on the surface of the various block copy sheets are each pressed against the back surface of the respective lithographic printing plate to cause the convex portions on the surface of the block copy sheet to be embedded into the back surface of the lithographic printing plate. In this manner, the back surface of the various lithographic printing plates are concaved in accordance with the convex portions on the block copy sheet.

The present invention will be described in greater detail with reference to the following Examples, but the invention should not be construed as being limited thereto.

EXAMPLES 1A TO 13A

Preparation of Inorganic Composite Particle 1

100 g of glass particles having an average diameter of 30 μm (GB731, produced by Toshiba Glass Co., Ltd.) were subjected to ultrasonic treatment in a 1 N aqueous solution of NaOH for about 30 minutes so that they were hydrophilicized on the surface thereof. Thereafter, the supernatant liquid was removed. The residue was then washed with water. To the residue were then added 200 g of methanol and 20 g of (3-glycidoxypropyl)trimethoxysilane (produced by Chisso Corporation). The mixture was then stirred at room temperature for about 1 hour so that the glass particles were subjected to coupling on the surface thereof. Thereafter, the supernatant liquid was removed.

Subsequently, to 100 g of silica particles having an average particle diameter of 5 μm were added 200 g of methanol and 20 g of 3-aminopropyl trimethoxysilane (produced by Chisso Corporation). The mixture was then stirred at room temperature for about 1 hour so that the silica particles were subjected to coupling on the surface thereof. Thereafter, to the mixture was added 100 g of the surface-treated glass particles obtained above. The mixture was then stirred at room temperature for about 2 hours. The mixture was then allowed to stand. The resulting supernatant liquid was then removed. The residue was vacuum-dried to obtain composite glass particles with an average particle diameter of 30 μm having silica particles with an average particle diameter of 5 μm adsorbed by the surface thereof.

Preparation of Inorganic Composite Particle 2

100 g of glass particles having an average diameter of 30 μm (GB731, produced by Toshiba Glass Co., Ltd.) were subjected to ultrasonic treatment in a 1 N aqueous solution of NaOH for about 30 minutes so that they were hydrophilicized on the surface thereof. Thereafter, the supernatant liquid was removed. The residue was then washed with water. To the residue were then added 200 g of methanol and 20 g of (3-glycidoxypropyl)trimethoxysilane (produced by Chisso Corporation). The mixture was then stirred at room temperature for about 1 hour so that the glass particles were subjected to coupling on the surface thereof. Thereafter, the supernatant liquid was removed.

Subsequently, to 100 g of $TiO_2$ particles having an average particle diameter of 2 μm were added 200 g of methanol and 20 g of 3-aminopropyl trimethoxysilane (produced by Chisso Corporation). The mixture was then stirred at room temperature for about 1 hour so that the $TiO_2$ particles were subjected to coupling on the surface thereof. Thereafter, to the mixture was added 100 g of the surface-treated glass particles obtained above. The mixture was then stirred at room temperature for about 2 hours. The mixture was then allowed to stand. The resulting supernatant liquid was then removed. The residue was vacuum-dried to obtain composite glass particles with an average particle diameter of 30 μm having silica particles with an average particle diameter of 5 μm adsorbed by the surface thereof.

Preparation of Organic Composite Particle 1

70 wt-% of low density polyethylene particles having an average particle diameter of 10 μm (Flow Beads CL-2080, produced by Sumitomo Seika chemicals Co., Ltd.) and 30 wt-% of polymethyl methacrylate particles having an average particle diameter of 0.4 μm (MP-1000, produced by Soken Chemical & Engineering Co., Ltd.) were subjected to dry agglomeration agitation process involving treatment by a hybridizer at 16,000 rpm for 5 minutes to obtain a composite.

Preparation of Organic Composite Particle 2

70 wt-% of high density polyethylene particles having an average particle diameter of 15 μm (Flow Beads HE-5023, produced by Sumitomo Seika chemicals Co., Ltd.) and 30 wt-% of polymethyl methacrylate particles having an average particle diameter of 0.8 μm (MP-1401, produced by Soken Chemical & Engineering Co., Ltd.) were subjected to dry agglomeration agitation process involving treatment by a hybridizer at 16,000 rpm for 5 minutes to obtain a composite.

Preparation of Organic Composite Particle 3

70 wt-% of low density polyethylene particles having an average particle diameter of 5 μm (Flow Beads LE-1080, produced by Sumitomo Seika chemicals Co., Ltd.) and 30 wt-% of polymethyl methacrylate particles having an average particle diameter of 0.4 μm (MP-1000, produced by Soken Chemical & Engineering Co., Ltd.) were subjected to dry agglomeration agitation process involving treatment by a hybridizer at 16,000 rpm for 5 minutes to obtain a composite.

Preparation of Organic-Inorganic Composite Particle 1

70 wt-% of low density polyethylene particles having an average particle diameter of 10 μm (Flow Beads CL-2080, produced by Sumitomo Seika chemicals Co., Ltd.) and 30 wt-% of silica particles having an average particle diameter of 0.4 μm were subjected to dry agglomeration agitation process involving treatment by a hybridizer at 16,000 rpm for 10 minutes to obtain a composite.

Preparation of Organic-Inorganic Composite Particle 2

70 wt-% of high density polyethylene particles having an average particle diameter of 10 μm (Flow Beads HE-5023, produced by Sumitomo Seika chemicals Co., Ltd.) and 30 wt-% of silica particles having an average particle diameter of 0.4 μm were subjected to dry agglomeration agitation process involving treatment by a hybridizer at 16,000 rpm for 10 minutes to obtain a composite.

Preparation of Organic-Inorganic Composite Particle 3

70 wt-% of glass particles having an average particle diameter of 30 μm (GB731, produced by Toshiba Glass Co., Ltd.) and 30 wt-% of polymethyl methacrylate particles having an average particle diameter of 0.8 μm (MP-1401, produced by Soken Chemical & Engineering Co., Ltd.) were subjected to dry agglomeration agitation process involving treatment by a hybridizer at 16,000 rpm for 5 minutes to obtain a composite.

Preparation of Organic-Inorganic Composite Particle 4

70 wt-% of glass particles having an average particle diameter of 5 μm and 30 wt-% of polymethyl methacrylate particles having an average particle diameter of 0.4 μm (MP-1401, produced by Soken Chemical & Engineering Co., Ltd.) were subjected to dry agglomeration agitation process involving treatment by a hybridizer at 16,000 rpm for 5 minutes to obtain a composite.

Preparation of Block Copy Sheet for Lithographic Printing Plate

To the surface of a substrate with a thickness of 100 μm comprising a polyethylene terephthalate (PET) was applied a composite particle dispersion having the formulation shown below using a wire bar in an amount of 5 $g/m^2$. In this manner, block copy sheets of Examples 1A to 13A were prepared.

| Formulation: | |
|---|---|
| Composite particle | X g |
| Acryl emulsion (40% aqueous solution) | 20 g |
| Water | 50 g |

As the lithographic printing plate there was used one obtained by subjecting Super Master Plus (total thickness: 130 μm) (produced by Agfa Gebalt Corp.), which is a silver diffusive light-sensitive material comprising a polyethylene terephthalate (PET) support having a thickness of 100 μm, to plate making by a specialized plate maker SPM415. The lithographic printing plate can be obtained also by electrophotographic plate making process.

Subsequently, the block copy sheet and lithographic printing plate thus obtained were each cut into a size of 400 mm long×560 mm wide. The block copy sheet and the lithographic printing plate thus cut were then laminated in such an arrangement that the roughened surface of the block copy sheet came in contact with the back surface of the lithographic printing plate. The laminate of the lithographic printing plate and the block copy sheet was mounted on the plate cylinder of a Type Oliber 52 single-sided press (produced by Sakurai Co., Ltd.). Using this press, printing was made on 2,000 sheets.

Prior to printing, a sponge impregnated with a processing solution G671c was squeezed over the surface of the lithographic printing plate. As the fountain solution there was used one obtained by diluting the processing solution G671c with water at a ratio of 1:1. As the ink there was used New Champion F Gloss 85 (produced by DAINIPPON INK & CHEMICALS, INC.).

After printing, the position of ruled lines printed on the printed matter obtained shortly after the beginning of printing and the position of ruled lines printed on the printed matter obtained after 2,000 sheets of printing were then compared to determine the positional deviation of the lithographic printing plate on the plate cylinder from shortly after the beginning of printing to after 2,000 sheets of printing.

COMPARATIVE EXAMPLES 1A TO 4A

As the block copy sheet there was prepared one obtained by forming convex portions, on the surface of a substrate with a thickness of 100 μm comprising a polyethylene terephthalate (PET) as in the foregoing examples, with glass particles having an average particle diameter of 30 μm or silica particles having an average particle diameter of 5 μm instead of composite particle. In this manner, block copy sheets of Comparative Examples 1A to 4A were prepared. These block copy sheets were each then laminated on the same lithographic printing plate as used in the foregoing examples. The laminate was then mounted on the same press as used in the foregoing examples. Using this press, printing was made on 2,000 sheets.

The results of evaluation of the foregoing examples and comparative examples are set forth in Table 1A.

TABLE 1A

| | Particle used | Added amount of particle | Uneven printing | Positional deviation of printing plate |
|---|---|---|---|---|
| Example 1A | Organic-inorganic composite particle 3 | 1 g | None | None |
| Example 2A | Inorganic composite particle 1 | 1 g | None | None |
| Example 3A | Inorganic composite particle 2 | 1 g | None | None |
| Example 4A | Organic composite particle 1 | 1 g | None | None |
| Example 5A | Organic composite particle 2 | 1 g | None | None |
| Example 6A | Organic-inorganic composite particle 1 | 1 g | None | None |
| Example 7A | Organic-inorganic composite particle 2 | 1 g | None | None |
| Comparative Example 1A | Glass particle GB731 | 1 g | None | Observed |
| Example 8A | Organic-inorganic composite particle 4 | 10 g | None | None |
| Example 9A | Organic-inorganic composite particle 4 | 5 g | None | None |
| Example 10A | Organic-inorganic composite particle 4 | 2 g | None | None |
| Example 11A | Organic composite particle 3 | 10 g | None | None |
| Example 12A | Organic composite particle 3 | 5 g | None | None |
| Example 13A | Organic composite particle 3 | 2 g | None | None |
| Comparative Example 2A | Silica having average particle diameter of 5 μm | 10 g | None | Observed |
| Comparative Example 3A | Silica having average particle diameter of 5 μm | 5 g | None | Observed |
| Comparative Example 4A | Silica having average particle diameter of 5 μm | 2 g | None | Observed |

As can be seen in Comparative Example 1A, the conventional particulate glass gave no uneven printing but causes some positional deviation of printing plate. On the contrary, as can be seen in Examples 1A to 7A, the block copy sheets comprising the various composite particles of the inventions caused no uneven printing and thus exerted an effect of preventing the positional deviation of printing plate.

In other words, it is presumed that the use of the composite particle of the invention provides an increase of the contact area with the back surface of the printing plate and an enhancement of the effect of catching the back surface of the printing plate, whereby the desired effect can be sufficiently exerted even if the composite particle is used in a small amount.

As can be seen in Comparative Examples 2A to 4A, where the conventional small diameter particles were used, the positional deviation of the printing plate could not be prevented regardless of the added amount of the particles. On the contrary, as can be seen in Examples 8A to 13A, the composite particles of the invention, even having a small diameter, could exert a sufficient effect of preventing uneven printing and positional deviation of printing plate, regardless of the added amount of the particles.

In other words, it is presumed that the use of the composite particle of the invention provides an increase of the contact area with the back surface of the printing plate and an enhancement of the effect of catching the back surface of the printing plate, whereby the desired effect can be sufficiently exerted.

In accordance with the first aspect of the present invention, the block copy sheet has, on the surface thereof, convex portions having a predetermined shape to concave the back surface of the lithographic printing plate when pressed against the back surface of the lithographic printing plate. The convex portion is made of a composite particle having protrusions provided on the surface thereof and having a hardness greater than that of the lithographic printing plate and a particle diameter of from 1 μm to 100 μm. In this arrangement, the composite particles are embedded into the lithographic printing plate, thereby making it possible to prevent the positional deviation of the printing plate without causing dot stain on the non-image area (uneven printing) even if the composite particle used has a wide range of diameters and the added amount of the composite particle falls within a wide range.

EXAMPLES 1B TO 10B AND COMPARATIVE EXAMPLES 1B TO 4B

Preparation of Block Copy Sheet

To the surface of a substrate with a thickness of 100 μm comprising a polyethylene terephthalate (PET) was applied a dispersion of non-spherical filler having the formulation shown below using a wire bar in an amount of 5 $g/m^2$. In this manner, block copy sheets of Examples 1B to 10B and Comparative Examples 1B to 4B were prepared.

| Formulation | |
|---|---|
| Non-spherical filler | X g |
| 50% Aqueous solution of acryl emulsion (AE815, produced by JSR Corporation) | 20 g |
| Water | 50 g |

As the lithographic printing plate there was used one obtained by subjecting Super Master Plus (total thickness: 130 μm) (produced by Agfa Gebalt Corp.), which is a silver diffusive light-sensitive material comprising a polyethylene terephthalate (PET) support having a thickness of 100 μm, to plate making by a specialized plate maker SPM415. The lithographic printing plate can be a direct-drawing printing plate comprising an image-receiving layer provided on a support made of a material other than metal or obtained also by electrophotographic plate making process.

Subsequently, the block copy sheet and lithographic printing plate thus obtained were each cut into a size of 400 mm long×560 mm wide. The block copy sheet and the lithographic printing plate thus cut were then laminated in such an arrangement that the roughened surface of the block copy sheet came in contact with the back surface of the lithographic printing plate. The laminate of the lithographic printing plate and the block copy sheet was mounted on the plate cylinder of a Type Oliber 52 single-sided press (produced by Sakurai Co., Ltd.). Using this press, printing was made on 2,000 sheets.

Prior to printing, a sponge impregnated with a processing solution G671c was squeezed over the surface of the lithographic printing plate. As the fountain solution there was used one obtained by diluting the processing solution G671c with water at a ratio of 1:1. As the ink there was used New champion F Gloss 85 (produced by DAINIPPON INK & CHEMICALS, INC.).

After printing, the position of ruled lines printed on the printed matter obtained shortly after the beginning of printing and the position of ruled lines printed on the printed matter obtained after 2,000 sheets of printing were then compared to determine the positional deviation of the lithographic printing plate on the plate cylinder from shortly after the beginning of printing to after 2,000 sheets of printing.

The results are set forth in Table 1B.

TABLE 1B

| Example No. | Type of filler (trade name) | Shape | Average length (μm) | Added amount (g) | % Contact area | Stain on non-image area | Positional deviation of printing plate | Peeling of filler |
|---|---|---|---|---|---|---|---|---|
| Example 1B | Talc (JA-46R; Asada Seifun Co., Ltd.) | Tablet | 7–11 | 5 | 2 | ○ | ○ | ○ |
| Example 2B | Mica (A-41; Yamaguchi Mica Kogyo K.K.) | Tablet | 20 | 1 | 0.6 | ○ | ○ | ○ |
| Example 3B | Mica (A-41; Yamaguchi Mica Kogyo K.K.) | Tablet | 20 | 5 | 1.1 | ○ | ○ | ○ |
| Example 4B | Mica (A-41; Yamaguchi Mica Kogyo K.K.) | Tablet | 20 | 10 | 3 | ○ | ○ | ○ |
| Example 5B | Glass flake (SQ-7; Izumitech Co., Ltd.) | Tablet | 7 | 5 | 2.5 | ○ | ○ | ○ |
| Example 6B | Wollastonite (HN; Tomoe Kogyo K.K.) | Needle | 40 long, 2.8 diameter | 5 | 1 | ○ | ○ | ○ |
| Example 7B | Potassium titanate whisker (Tismo D; Otsuka Chemical Co., Ltd.) | Needle | 15 long, 0.4 diameter | 5 | 1.6 | ○ | ○ | ○ |
| Example 8B | Aluminum borate whisker (YS1; Shikoku Chemicals Corp.) | Needle | 20 long, 0.8 diameter | 5 | 1.3 | ○ | ○ | ○ |
| Example 9B | Tetrapod ZnO (Panatetra; Matsushita Amtech Co., Ltd.) | Tetrapod | 20 long, 1.5 diameter | 5 | 0.5 | ○ | ○ | ○ |
| Example 10B | Mica powder | Tablet | 200 | 5 | 0.1 | ○ | ○ | ○ |
| Comparative Example 1B | Mica powder (80-D; KURARAY CO., LTD.) | Tablet | 230 | 5 | 0.4 | ○ | × | × |
| Comparative Example 2B | Lipophilic synthetic smectite (SWF; CO-OP CHEMICAL CO., LTD.) | Tablet | 5 | 5 | 3.6 | × | ○ | ○ |
| Comparative Example 3B | Mica powder (200-W; KURARAY CO., LTD.) | Tablt | 100 | 0.1 | 0.05 | × | ○ | ○ |
| Comparative Example 4B | Glass ball (GB731; Toshiba Glass Co., Ltd.) | Spherical | 30 | 1 | 1 | ○ | × | ○ |

The criterion for evaluation in Tables 1B above and the tables below are as follows:

| Criterion of evaluation: | |
|---|---|
| Positional deviation of printing plate: | ○: 50 μm or less; X: greater than 50 μm |
| Stain on non-image area: | ○: None; X: Observed |
| Peeling of filler: | ○: None; X: Observed |

In addition to the positional deviation of the printing plate, stain on non-image area was evaluated on the printed matter. The stain on non-image area is interpreted as follows. If there are coarse fillers on the surface of the block copy sheet, these coarse fillers deform a soft support such as PET of the printing plate when used in printing in the form of laminate with the printing plate. The surface of the printing plate is then pushed up at the deformed area, causing spot-like print stain that is eventually observed as a non-image area stain on the printed matter.

As can be seen in Examples 1B to 10B, the block copy sheet having convex portions formed by non-spherical fillers caused no non-image area dot stain and was not liable to peeling of fillers, making it possible to effectively prevent the positional deviation of the printing plate.

However, as can be seen in Comparative Example 1B, even if convex portions were formed by non-spherical fillers, and the contact area of the block copy sheet with the back surface of the lithographic printing plate was proper, there caused fillers to be peeled off from the block copy sheet, the printing plate to be positionally deviated and dot stain to occur on non-image area when the average length of the non-spherical fillers was greater than 200 μm.

As can be seen in Comparative Example 2B, when the contact area of the block copy sheet with the back surface of the lithographic printing plate exceeded 3.5%, the positional deviation of the printing plate could be prevented, but dot stain occurred on non-image area.

As can be seen in Comparative Example 3B, when the contact area of the block copy sheet with the back surface of the lithographic printing plate fell below 0.1%, the printing plate was positionally deviated.

As can be seen in Comparative Example 4B, the block copy sheet comprising spherical fillers, even being in contact with the back surface of the lithographic printing plate with a proper area, was insufficiently embedded into the back surface of the lithographic printing plate and thus caused the printing plate to be positionally deviated, though causing no dot stain on non-image area.

As clarified above, when the non-spherical filler of the invention is incorporated in the block copy sheet, even if the contact area of the block copy sheet with the back surface of the lithographic printing plate is very small, the resulting block copy sheet can exert a great effect of preventing the positional deviation of the printing plate which is impossible with the use of spherical fillers, and this effect can be exerted even with a reduced contact area of the block copy sheet with the lithographic printing plate, causing little dot stain on non-image area.

EXAMPLES 11B TO 19B

Block copy sheets were prepared in the same manner as in Example 1B, except that two or more kinds of non-spherical fillers as set forth in Table 2B were mixed. These block copy sheets were then laminated on the lithographic printing plate for printing. The results are set forth in Table 2B.

TABLE 2B

| Example No. | Type of fillers (trade name) in admixture: (wt %) | Shape | Average length (μm) | Added amount (g) | % Contact area | Stain on non-image area | Positional deviation of printing plate | Peeling of filler |
|---|---|---|---|---|---|---|---|---|
| Example 11B | Talc (JA-46R; Asada Seifun Co., Ltd.): 50 | Tablet | 7–11 | 5 | 1.4 | ○ | ○ | ○ |
| | Mica (A-41; Yamaguchi Mica Kogyo K.K.): 50 | Tablet | 20 | | | | | |
| Example 12B | Mica (A-41; Yamaguchi Mica Kogyo K.K.): 50 | Tablet | 20 | 5 | 0.8 | ○ | ○ | ○ |
| | Tetrapod ZnO (Panatetra; Matsushita Amtech Co., Ltd.): 50 | Tetrapod | 20 long, 1.5 dia. | | | | | |
| Example 13B | Mica (A-41; Yamaguchi Mica Kogyo K.K.): 25 | Tablet | 20 | 5 | 1.3 | ○ | ○ | ○ |
| | Tetrapod ZnO (Panatetra; Matsushita Amtech Co., Ltd.): 50 | Tetrapod | 20 long, 1.5 dia. | | | | | |
| Example 14B | Mica (A-41; Yamaguchi Mica Kogyo K.K.): 75 | Tablet | 20 | 5 | 1.3 | ○ | ○ | ○ |
| | Tetrapod ZnO (Panatetra; Matsushita Amtech Co., Ltd.): 50 | Tetrapod | 20 long, 1.5 dia. | | | | | |
| Example 15B | Glass flake (SQ-7; Izumitech Co., Ltd.): 50 | Tablet | 7 | 5 | 2.5 | ○ | ○ | ○ |
| | Aluminum borate whisker (YS1; Shikoku Chemicals Corp.): 50 | Needle | 20 long, 0.8 dia. | | | | | |
| Example 16B | Talc (JA-46R; Asada Seifun Co., Ltd.): 50 | Tablet | 7–11 | 5 | 2 | ○ | ○ | ○ |
| | Wollastonite (HN; Tomoe Kogyo K.K.): 50 | Needle | 40 long, 2.8 dia. | | | | | |
| Example 17B | Potassium titanate whisker (Tismo D; Otsuka Chemical Co., Ltd.): 50 | Needle | 15 long, 0.4 dia. | 5 | 0.9 | ○ | ○ | ○ |
| | Tetrapod ZnO (Panatetra; Matsushita Amtech Co., Ltd.): 50 | Tetrapod | 20 long, 1.5 dia. | | | | | |
| Example 18B | Mica (A-41; Yamaguchi Mica Kogyo K.K.): 25 | Tablet | 20 | 5 | 1.3 | ○ | ○ | ○ |
| | Aluminum borate whisker (YS1; Shikoku Chemicals Corp.): 30 | Needle | 20 long, 0.8 dia. | | | | | |
| | Tetrapod ZnO (Panatetra; Matsushita Amtech Co., Ltd.): 30 | Tetrapod | 20 long, 1.5 dia. | | | | | |
| Example 19B | Glass flakes (SQ-7; Izumitech Co., Ltd.): 40 | Tablet | 7 | 5 | 1.5 | ○ | ○ | ○ |
| | Aluminum borate whisker (YS1; Shikoku Chemicals Corp.): 30 | Needle | 20 long, 0.8 dia. | | | | | |
| | Tetrapod ZnO (Panetetra; Matsushita Amtech Co., Ltd.): 30 | Tetrapod | 20 long, 1.5 dia. | | | | | |

As can be seen in Examples 11B to 19B, even when used in admixture at an arbitrary ratio, the non-spherical fillers of the invention could exert the same effect as used singly.

EXAMPLES 20B TO 23B

Block copy sheets were prepared in the same manner as in Example 1B except that the binder resins and solvents set forth in Table 3B were used. These block copy sheets were laminated on the printing plate for printing. The results are set forth in Table 3B.

As can be seen in the foregoing results, block copy sheets according to the second aspect of the present invention can prevent the positional deviation of the printing plate and the occurrence of stain on non-image area.

In accordance with the second aspect of the present invention, the lithographic printing plate can be effectively caught by the block copy sheet despite the small contact area, no dot stain occurs on non-image area because of the small contact area and the positional deviation of printing plate can be prevented.

TABLE 3B

| Example No. | Binder (trade name) | Solvent | % Contact area | Stain on non-image area | Positional deviation of printing plate | Peeling of filler |
|---|---|---|---|---|---|---|
| Example 20B | Urethane emulsion (U-coat UX-4300; SANYO CHEMICAL INDUSTRIES, LTD.) | Water | 2 | ○ | ○ | ○ |
| Example 21B | Styrene butadiene latex (Nipol LX407F; DAICEL CHEMICAL INDUSTRIES, LTD.) | Water | 1.6 | ○ | ○ | ○ |
| Example 22B | PVA220 (KURARAY CO., LTD./Glyoxal crosslinking) | Water | 0.8 | ○ | ○ | ○ |
| Example 23B | Acryl polymer (FUJIKURA KASEI CO., LTD.) | Toluene | 3 | ○ | ○ | ○ |

As can be seen in Examples 20B to 23B, as the binder resin for the non-spherical fillers of the invention there may be used a film-forming resin such as one obtained by crosslinking a water-soluble resin, lipophilic resin emulsion and lipophilic resin.

While the invention has been described in detail and with reference to specific embodiments thereof, it will be apparent to one skilled in the art that various changes and modifications can be made therein without departing from the spirit and scope thereof.

What is claimed is:

1. A block copy sheet for lithographic printing plate to be interposed between a plate cylinder and a lithographic printing plate having a front surface and a back surface, at least the back surface being made of a material other than metals, wherein said block copy sheet have convex portions provided on a surface thereof, said convex portions having a predetermined shape so as to concave the back surface of the lithographic printing plate when pressed against the back surface of the lithographic printing plate, and wherein said convex portions comprises a composite particle having protrusions provided on the surface thereof and having a hardness greater than that of the back surface of the lithographic printing plate and a particle diameter of from 1 μm to 100 μm.

2. The block copy sheet according to claim 1, wherein said composite particle comprises an inorganic material having a particle diameter of from 1 μm to 100 μm.

3. The block copy sheet according to claim 2, wherein said inorganic material is selected from the group consisting of glass, oxides and sulfides.

4. The block copy sheet according to claim 1, wherein said composite particle comprises an organic material having a particle diameter of from 1 μm to 100 μm.

5. The block copy sheet according to claim 4, wherein said organic material is selected from the group consisting of acrylic resin, polyethylene, polypropylene, and polystyrene.

6. The block copy sheet according to claim 1, wherein said composite particle comprises an organic-inorganic composite material having a particle diameter of from 1 μm to 100 μm.

7. The block copy sheet according to claim 1, wherein the sum of the maximum sectional area of said convex portions parallel to the surface of the sheet per unit area is from 0.05% to 4%.

8. The block copy sheet according to claim 1, wherein said composite particle has a particle diameter of from 3 to 80 μm.

9. The block copy sheet according to claim 1, wherein said composite particle has a particle diameter of from 5 to 50 μm.

10. A block copy sheet for lithographic printing plate to be interposed between a plate cylinder and a lithographic printing plate having a front surface and a back surface, at least the back surface being made of a material other than metals, wherein said block copy sheet have convex portions provided on a surface thereof, said convex portions having a predetermined shape so as to concave the back surface of the lithographic printing plate when pressed against the back surface of the lithographic printing plate, wherein the contact area of said convex portions and the back surface of the lithographic printing plate is from 0.6% to 3.0% of the area of the back surface of the lithographic printing plate, and wherein said convex portions comprises non-spherical fillers having an average length of from 1 μm to 200 μm.

11. The block copy sheet according to claim 10, wherein said non-spherical fillers have a tabular shape.

12. The block copy sheet according to claim 11, wherein said tabular-shaped fillers comprise at least one member selected from the group consisting of talc, mica, glass flake and synthetic hydrotalcite.

13. The block copy sheet according to claim 10, wherein said non-spherical fillers have an acicular shape.

14. The block copy sheet according to claim 13, wherein said acicular-shaped fillers comprise at least one member selected from the group consisting of wollastonite, potassium titanate, basic magnesium sulfate, sepiolite, xonotlite and aluminum borate.

15. The block copy sheet according to claim 10, wherein said non-spherical fillers have a tetrapod shape.

16. The block copy sheet according to claim 15, wherein said tetrapod-shaped fillers comprise zinc oxide.

17. The block copy sheet according to claim 10, wherein said non-spherical fillers have an average length of from 3 μm to 100 μm.

* * * * *